United States Patent
Anzai et al.

(10) Patent No.: US 6,833,607 B2
(45) Date of Patent: Dec. 21, 2004

(54) RESIN-MOLDED SEMICONDUCTOR DEVICE THAT INCLUDES AT LEAST ONE ADDITIONAL ELECTRONIC PART

(75) Inventors: Noritaka Anzai, Tokyo (JP); Makoto Terui, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/125,396

(22) Filed: Apr. 19, 2002

(65) Prior Publication Data

US 2003/0102543 A1 Jun. 5, 2003

(30) Foreign Application Priority Data

Nov. 30, 2001 (JP) ........................................ 2001-365613

(51) Int. Cl.[7] ........................ H01L 23/48; H01L 23/495
(52) U.S. Cl. ...................... 257/666; 257/692; 257/693; 257/773
(58) Field of Search ................................ 257/666, 667, 257/668, 669, 672, 676, 685, 690, 692, 693, 687–689, 723, 773, 701, 730, 732, 733, 779, 95, 100, 99

(56) References Cited

U.S. PATENT DOCUMENTS 3,951,722 A * 4/1976 Howson et al.
5,818,105 A * 10/1998 Kouda
6,379,997 B1 * 4/2002 Kawahara et al.

FOREIGN PATENT DOCUMENTS

| JP | 356043376 | * 4/1981 |
| JP | 59-158334 | 10/1984 |
| JP | 61-147559 | 5/1986 |
| JP | 03057251 | * 12/1991 |
| JP | 05-275602 | 10/1993 |
| JP | 06-177314 | 6/1994 |
| JP | 10-209365 | * 7/1998 |

* cited by examiner

Primary Examiner—Long Pham
Assistant Examiner—Dilinh Nguyen
(74) Attorney, Agent, or Firm—Rabin & Berdo, P.C.

(57) ABSTRACT

A resin-molded semiconductor device capable of preventing an adhesive from flowing out along conductive paths from where electronic parts are attached on the conductive paths when the electronic parts are fixed to the conductive paths of a semiconductor package. The semiconductor device comprises a semiconductor chip (10), a plurality of conductive paths (12) connected to the semiconductor chip through conductive wires (11) extending from said chip, and an electronic part (13) mounted in such a manner as to electrically connect to two pieces of the conductive paths through the intermediary of an adhesive showing fluidity before hardening and molded in one body the semiconductor chip. In the conductive path, a raised portion is provided to prevent the adhesive from flowing out along the conductive path in the longitudinal direction of the conductive path before the adhesive hardens.

17 Claims, 5 Drawing Sheets

RESIN-MOLDED SEMICONDUCTOR DEVICE THAT INCLUDES AT LEAST ONE ADDITIONAL ELECTRONIC PART

FIELD OF THE INVENTION

The present invention relates to a semiconductor device having a semiconductor chip, in which a semiconductor integrated circuit is formed, and an electronic part, such as a resistor or a capacitor, molded by a resin in a single package, and more particularly relates to a structure for attaching those electronic parts to the conductive paths.

RELATED ART

The so-called semiconductor packages have been used, which are resin-molded integrated products, each comprising a semiconductor IC chip, conductive paths electrically connected through bonding wires to the connection terminals of the chip, and an electronic part, such as a resistor and a capacitor provided on the conductive paths. JP-A-10-209365 discloses one of the conventional techniques for mounting an electronic part in a semiconductor package as mentioned above.

In a semiconductor package in the prior art, a plurality of leads separate from the lead frame are used as the conductive paths, and an electronic part such as mentioned above is mounted in such a manner as to connect to the corresponding leads. The electronic part is fixed to the leads by using an adhesive, which has electrical conductivity and exhibits fluidity before it hardens.

In the prior art, however, when fixing an electronic part to the leads, it sometimes occurs that the above-mentioned adhesive flows out in the longitudinal direction of the leads from the area on the leads where the electronic part is attached. When the flowing adhesive reaches the mounting point of bonding wire interconnecting the lead with the connection terminal of the semiconductor chip, faulty connection is likely to occur during the wire connection process, in other words, the bonding process.

On the lead, the electronic part is mounted raised upwards by an amount corresponding to the thickness of the adhesive lying between the lead and the electronic part. For this reason, the height of the package may increase by an amount corresponding to the thickness of the adhesive. Therefore, there has been demand for a packaging technique that can prevent an increase in the height of the package caused by an increase in the thickness of the adhesive layer.

Accordingly, an object of the present invention is to provide a resin-molded semiconductor device having an adhesion structure that prevents the adhesive material from flowing from the area of adhesion where the electronic part is attached to the conductive wire.

Another object of the present invention is to provide a semiconductor device that can restrict an increase in the package thickness attributable to the adhesive layer.

SUMMARY OF THE INVENTION

To achieve the above objects, the present invention adopts resin-molded semiconductor devices of the following aspects:

According to a first aspect of the present invention, there is provided a resin-molded semiconductor device including:
a semiconductor chip with connection terminals, a plurality of conductive paths each connected to the semiconductor chip through conductive wire each extending from the connection terminals; and an electronic part mounted on two pieces of the conductive paths in such a manner as to electrically connect to the conductive paths through a conductive adhesive showing fluidity before hardening and applied between each of the connection terminal of the electronic part and the conductive paths corresponding to each of the connection terminal, and the electronic part being molded in one body with the semiconductor chip by a resin, wherein each of the conductive paths is provided with a raised portion to prevent the adhesive from flowing out along the conductive path in longitudinal direction of the conductive path before hardening.

According to the semiconductor device of the first aspect, by the presence of the raised portion in the conductive path, when an electronic part is attached to the conductive path, the adhesive can be prevented from overflowing onto the conductive path beyond the area where the electronic part is attached. Therefore, it is possible to preclude faulty connection in the bonding process of attaching conductive wires to the conductive paths.

The above-mentioned raised portion may be formed by a partition member provided on the conductive paths. For the partition member, an electrically insulating material may be used, and as this insulating material, it is possible to adopt a polyimide material in a strip form having an adhesion surface which is attached to the conductive path.

According to a second aspect of the present invention, a resin-molded semiconductor device including:
a semiconductor chip with connection terminals, a plurality of conductive paths each connected to the semiconductor chip through conductive wire each extending from the connection terminals; and an electronic part mounted on two pieces of the conductive paths in such a manner as to electrically connect to the conductive paths through a conductive adhesive showing fluidity before hardening and applied between each of the connection terminal of the electronic part and the conductive paths corresponding to each of the connection terminal, and the electronic part being molded in one body with the semiconductor chip by a resin, wherein, in each of the conductive paths on which the electronic part is mounted has a recess accommodating the connection terminal of an electronic part, and the electronic part is connected to the corresponding conductive path at the recesses through the adhesive.

According to the semiconductor device of the second aspect, by the presence of the recess in each conductive path, when an electronic part is attached to a conductive path, the adhesive can be prevented from flowing out on the conductive path beyond the area where the electronic part is attached. Therefore, improper connection can be prevented in the bonding process of mounting conductive wires to the conductive paths.

Moreover, because an electronic part is attached to the recess, the height from the conductive path to the top surface of the electronic part can be reduced by an amount corresponding to the depth of the recess.

The recess provided in each conductive path can be formed in a manner of being across the conductive path in width, so that the adhesive can be prevented from flowing out along the conductive path in the longitudinal direction of the conductive path before it hardens.

The recess may be defined by a groove formed by partially removing the flat surface of the conductive path. Or, the recess may be defined by a deformation impressed in the conductive path.

According to a third aspect of the present invention, a resin-molded semiconductor device including:

a semiconductor chip with connection terminals, a plurality of conductive paths each connected to the semiconductor chip through conductive wire each extending from the connection terminals; and an electronic part mounted on two pieces of the conductive paths in such a manner as to electrically connect to the conductive paths through a conductive adhesive applied between each of the connection terminal of the electronic part and the conductive path corresponding to each of the connection terminal, and the electronic part being molded in one body with the semiconductor chip by a resin, wherein the adhesive is an adhesive film having electric conductivity.

According to the semiconductor device of the third aspect, because an adhesive film is used as the above-mentioned adhesive, when an electronic part is attached to the conductive path, the adhesive can be prevented from flowing out. Therefore, improper connection can be prevented in the bonding process for attaching conductive wires to the conductive paths.

For the above-mentioned adhesive film, synthetic resin film may be used, which contains conductive particulates dispersed and hardens when it is heated. This synthetic resin film may be formed by a thermosetting or thermoplastic resin material.

The semiconductor device according to the present invention may be applied to packages using leads separated from a lead frame for the conductive paths, such as an SOP (Small Outline Package). In the above-mentioned lead, a deformed portion may be formed to offer a step portion in such a way that the above-mentioned electronic device is attached to an area at a lower level than the other area. In this way, the height of an IC package can be decreased.

Further, the above-mentioned semiconductor device of the present invention may be applied to packages, such as a BGA package, in which the above-mentioned semiconductor chip is mounted on an insulating film or on a substrate of glass, metal or the like. In this package, a conductive pattern formed on the above-mentioned insulating film may be formed as the conductive paths mentioned above.

With the above configurations, when mounting electronic parts to the conductive paths, the adhesive can be prevented from flowing on the conductive paths beyond the areas for attaching the electronic parts. Therefore, improper connection can be precluded in the bonding process for connecting the conductive wires to the conductive paths.

DESCRIPTION OF PREFERRED EMBODIMENTS

Preferred embodiments of the present invention will be described in the following.

<Embodiment 1>

Figure 1:
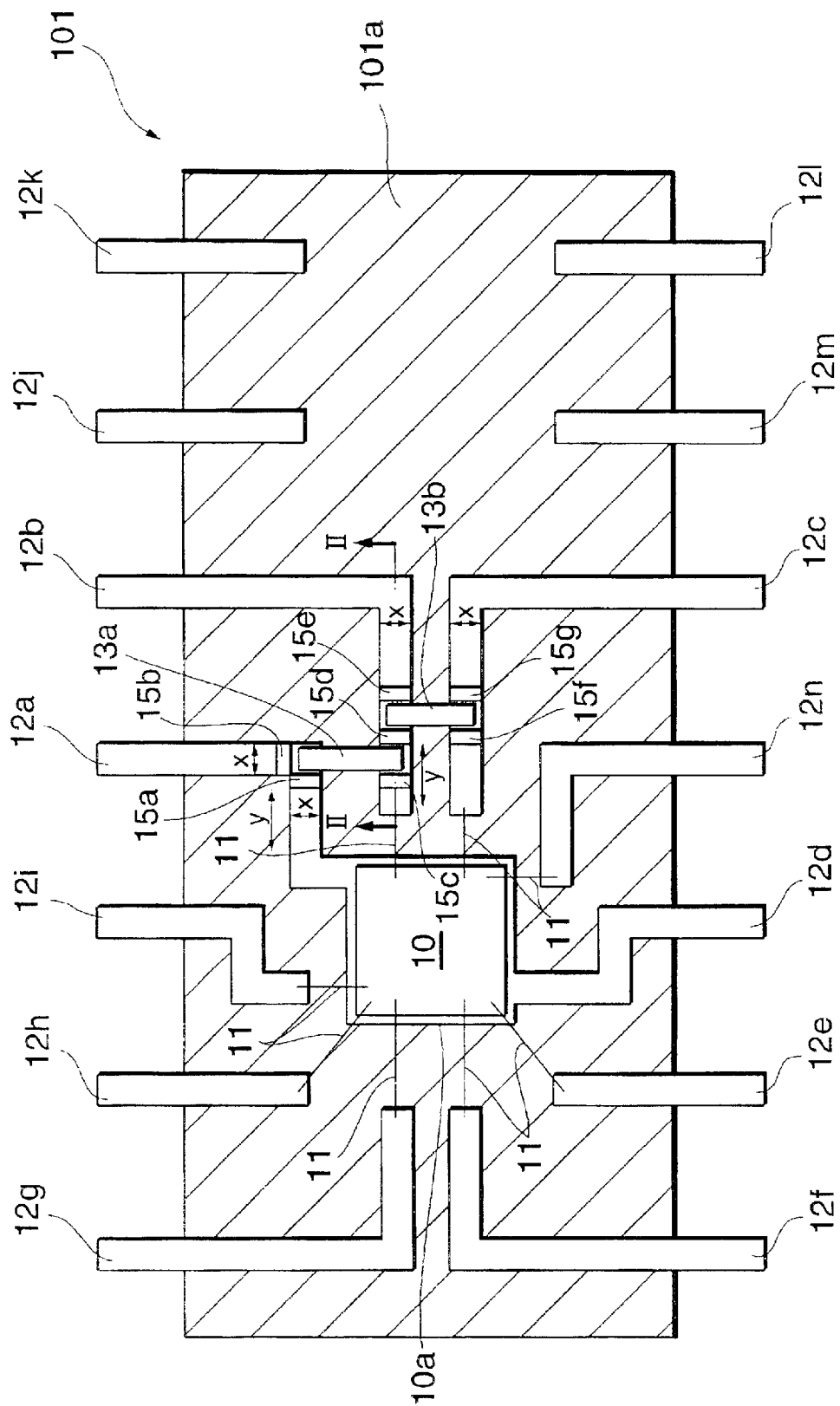
FIG. 1 is a plan view showing the inside of the a resin-molded semiconductor device according to a first embodiment of the present invention.
Figure 2:
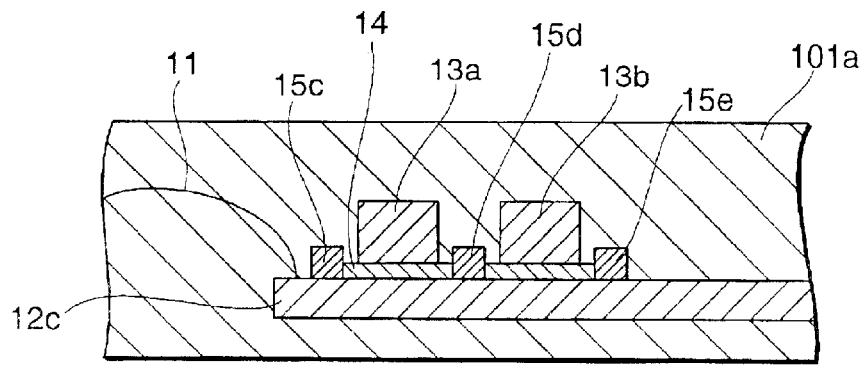
FIG. 2 is a sectional view taken along line II—II shown in FIG. 1.

The features of the semiconductor device according to the present invention are most clearly shown in FIG. 1 and FIG. 2, which is a sectional view taken along line II—II in FIG. 1. Before describing referring to those drawings, a resin-molded semiconductor device of the present invention will be outlined referring to FIG. 3.

Figure 3:
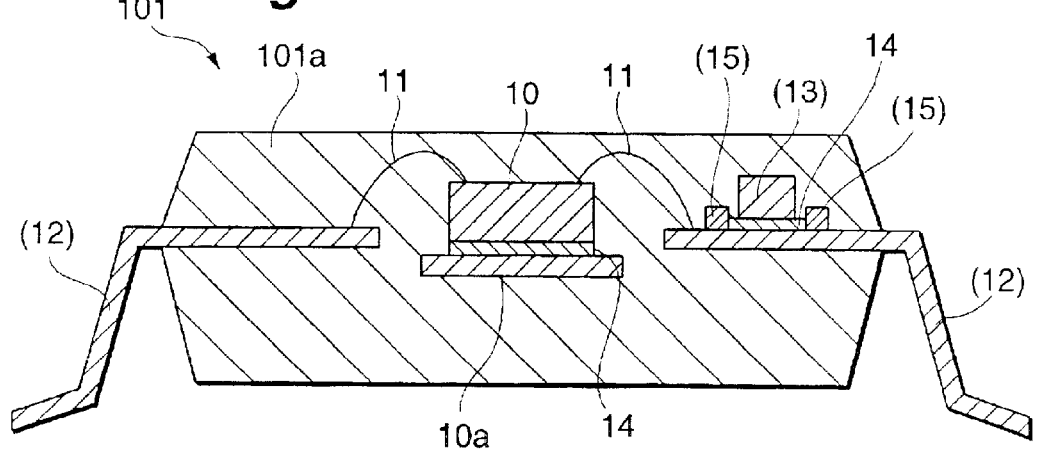
FIG. 3 is a schematic sectional view of the resin-molded semiconductor device according to the first embodiment of the present invention.

A resin-molded semiconductor device 101 according to a first embodiment of the present invention, as shown in FIG. 3, is a well-known semiconductor package which incorporates a semiconductor chip 10 having a semiconductor integrated circuit mounted in it, and an electronic part 13 mounted in such a manner as to connect to a plurality of conductive paths, in other words, to leads 12, in a single resin-molded body through the intermediary of bonding wires 11 as the conductive wires. In the example in FIG. 3, a so-called SOP (Small Outline Package) is illustrated, which has connection terminals extending from two sides of the package.

FIG. 1 is a plan view of the package 101 shown by removing an upper portion of the resin 101a to clearly indicate the inside structure of the package 101.

As shown in FIGS. 1 and 3, the package 101 has a plurality of leads 12 (12a~12n), which are composed of the remaining parts of a lead frame after the frame portion is cut off, are arranged in the vicinity of a semiconductor chip 10 placed on a die pad 10a of the lead frame (The frame portion has been cut off in FIGS. 1 and 3). The leads 12 and the die pad 10a are arranged on the same plane in the resin 101a.

A plurality of leads 12 (12b~12c, 12e~12n), except for the leads 12a and 12d extending from the die pad 10a, are at one end spaced apart from the die pad 10a. Those leads 12 are electrically connected, each at one end, to the connection terminals of the semiconductor chip through bonding wires which are connected by a predetermined connection process, more specifically, by a bonding process. As shown in FIG. 3, the leads 12 serve at the other end as connection terminals extending from the package.

Between predetermined leads 12, electronic parts 13 (13a or 3b), such as a resistor of a capacitor, are mounted as have conventionally been done. In the example of FIG. 1, the electronic part 13a is mounted to connect to the leads 12a and 12b, and the electronic part 13b is mounted to connect to the leads 12b and 12c.

To fix the electronic parts 13 to the leads 12a to 12c, an adhesive 14 is used which shows electrical conductivity, so that the leads 12a to 12c are electrically connected to the electronic parts 13 by the adhesive 14. For the adhesive 14, an adhesive made by adding a conductive material such as silver to a well-known epoxy adhesive that has fluidity, for example, may be used.

Around the electronic parts, strip-shaped partition members 15 (15a~15g) are provided to form raised portions that stretch in the width direction x of the leads 12a to 12c and that protrude from the top surface of the leads. The partition members 15 prevent the outflow of the adhesive 14 from the areas of adhesion of the electronic parts 13 along the leads 12a to 12c.

For the partition members 15 (15a to 15g), a well-known polyimide material showing insulating properties, for example, may be used, and they are fixed to the leads 12a to 12c by a predetermined heating process, for example.

As shown in FIG. 1, the lead 12a is provided with a pair of partition members 15a and 15b, which are arranged as if to hold between them one end of the electronic part 13a in the bend portion of the lead 12a to define the area of adhesion for accommodating the one end of the electronic part 13a in the bend portion of the lead 12a. The adhesive 14 applied to the area of adhesion is blocked by the partition member 15a, thereby preventing it from flowing beyond the bend portion into the die pad 10a.

Three partition members 15c, 15d and 15e are provided on the lead 12b.

More particularly, a partition member 15c is disposed between the lead end of the lead 12b, to which the above-mentioned bonding wire is attached by the bonding process, and the other end of the electronic part 13a arranged spaced apart from the above-mentioned lead end. A partition member 15d is disposed between the other end of the electronic part 13a and one end of an electronic part 13b arranged spaced apart from the above-mentioned other end in such a manner as if to separate the two electronic parts. The partition members 15c and 15d define between them an adhesion area for the other end of the electronic part 13a. The adhesive 14 applied to this adhesion area is prevented by the partition member 15c from flowing beyond the above-mentioned area to the lead end mentioned above.

The partition member 15e is disposed on the side opposite the partition member 15d across the one end of the electronic part 13b. This partition member 15e, in cooperation with the partition member 15d defines an area of adhesion for the one end of the electronic part 13b. Because the adhesion areas for the two electronic parts 13 are separated by the partition member 15d, the adhesion 14 is prevented from flowing into the opposite adhesion area.

Because the partition member 15d separating the two adhesion areas is provided on the lead 12b, it is possible to mount the electronic parts 13a and 13b spaced apart in time from each other. When the two electronic parts 13 (13a and 13b) are mounted simultaneously, the partition member 15d can be done away with.

On the lead 12c, partition members 15f and 15g are provided as if to hold between them the other end of the electronic part 13b extending from the lead 12b to define the adhesion area for the other end of the electronic part 13b. The partition member 15f prevents the adhesive 14 from flowing to the lead end of the lead 12c.

The partition members 15b, 15e and 15g, which are provided on the leads (12a to 12c) and remotest from the semiconductor chip 10, prevent the adhesive 14 from flowing from the adhesion areas of the electronic parts 13 to the other ends of the leads. Those partition members 15b, 15e and 15g may be omitted with proper discretion.

According to the resin-molded semiconductor device in the first embodiment of the present invention, in other words, in the case of the package 101, when an electronic parts 13 are attached to the leads 12, the adhesive 14 for fixing the electronic parts can be prevented from flowing along the leads 12 in the longitudinal direction y of the leads 12, thereby preventing the adhesive from spreading into the area beyond the adhesion areas of the electronic parts 13. Accordingly, it is possible to perform a suitable bonding process of connecting the bonding wires 11 to the ends of the leads, without effects from the adhesive 14.

Because there is the cured adhesive 14 between the electronic part 13a or 13b and a lead 12 to which the electronic part is attached, the electronic parts 13 are encapsulated in a resin 101a with the electronic parts raised in height depending on the thickness of the adhesive. This results in an increased height of the package, often making it necessary to modify the resin casting mold due to the increase in package height.

Figure 4:
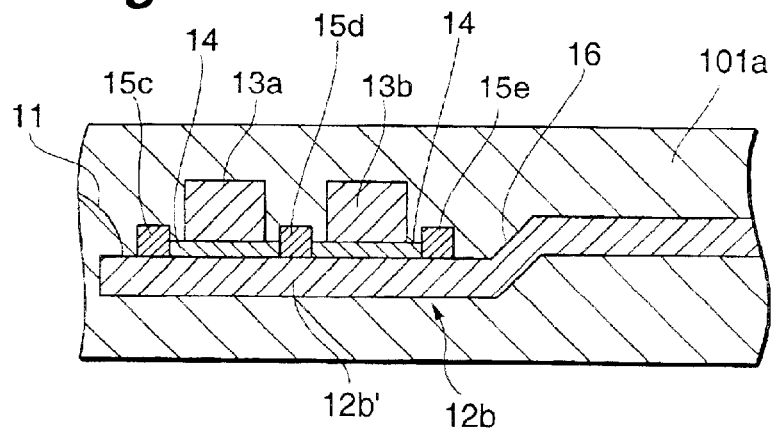
FIG. 4 is a partial sectional view of a modification of the first embodiment.

A step portion 16 as shown in FIG. 4 should desirably be provided in the lead 12b, for example, to prevent an increase in the height of the package. In the illustrated example, as in the earlier-mentioned example, the step portion 16 is formed in a cranked shape, and electronic parts 13a and 13b can be disposed on the lower-level portion 12b' of the lead 12b which is defined by the step portion 16.

Therefore, the top surfaces of the electronic parts can be lowered inside the package by an amount corresponding to the step (a difference in level), which makes it possible to prevent an increase in the thickness of the package 101 without changing the height of that portion of the resin 101a in FIG. 3, which corresponds the electric part (13) is buried.

<Embodiment 2>

Figure 5:
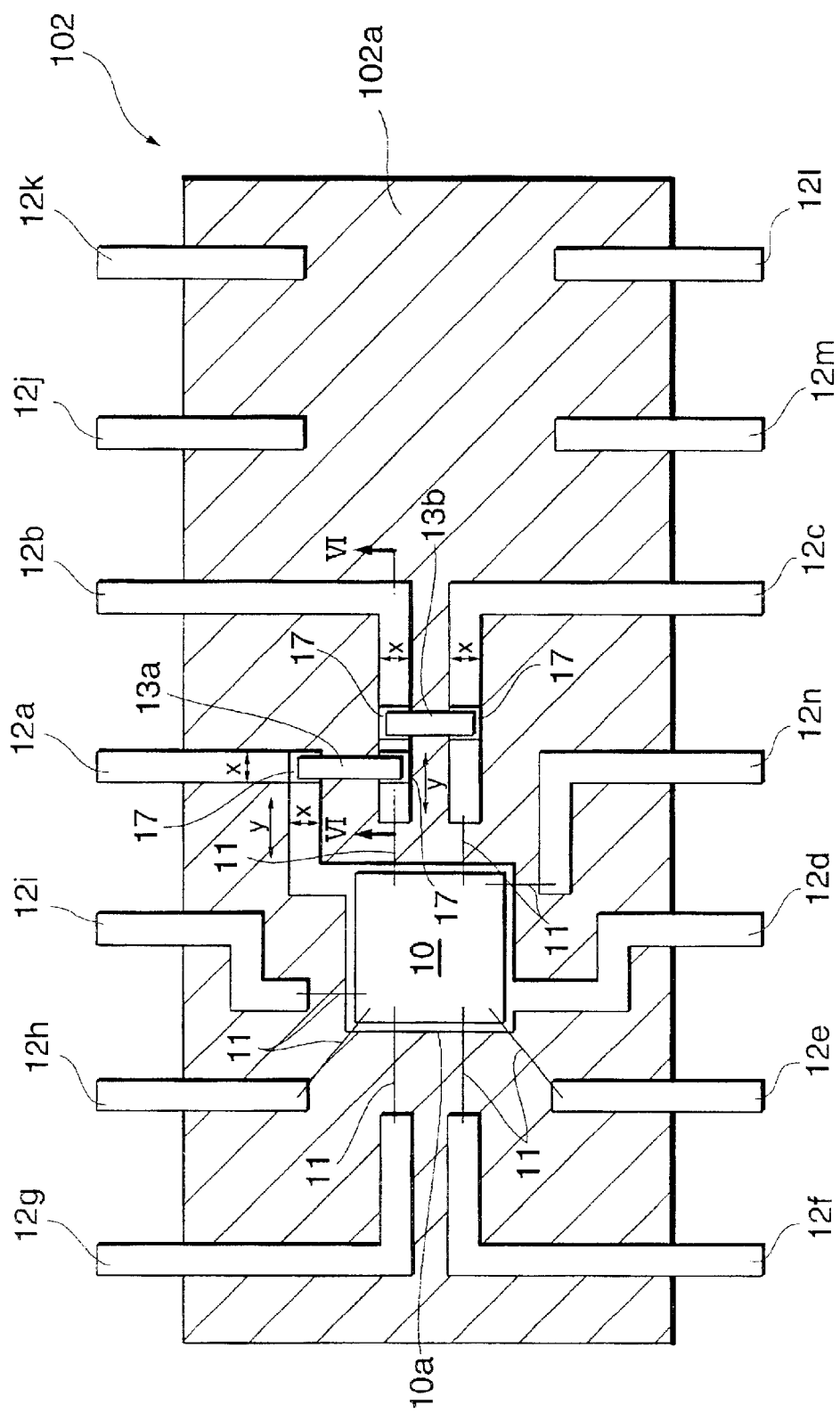
FIG. 5 is a plan view showing the inside of a resin-molded semiconductor device according to a second embodiment of the present invention.

FIG. 5 shows a resin-molded semiconductor device 102 according to a second embodiment of the present invention. In the semiconductor package 102 according to the second embodiment in FIG. 5, the adhesion areas of electronic parts 13 are defined by recesses 17 intersecting the leads 12 across the width x.

Figure 6:
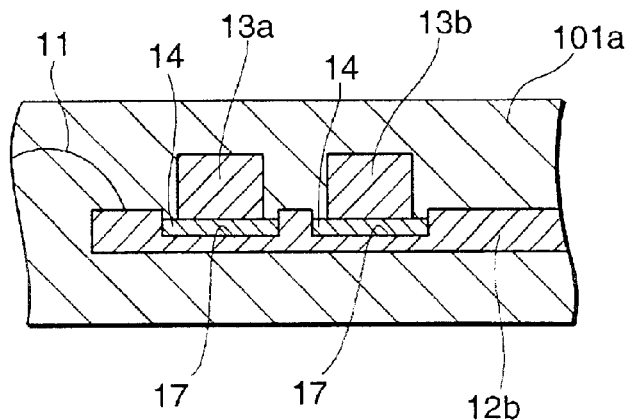
FIG. 6 is a sectional view taken along line VI—VI shown in FIG. 5.

FIG. 6 shows a sectional view taken along line VI—VI in FIG. 5.

As is obvious from FIG. 6 showing one 12b of the leads 12, the recesses 17 are defined by shallow grooves which are formed by removing the flat top surface of the lead 12b and which intersect the lead 12b across the width. To form the shallow grooves, the portions of the leads 12 as the adhesion areas for the electronic parts 13 can be subjected to grinding, etching or a like process.

The recesses 17 are formed in the predetermined leads 12a to 12c to accommodate the electronic parts 13a and 13b, and in the recesses 17, the connection terminals of the electronic parts 13 are electrically connected to the leads 12a to 12c through the intermediary of an adhesive 14 like the one used in the first embodiment.

When the electronic parts 13 (13a or 13b) are attached to the leads 12a to 12c, the adhesive 14 applied inside the recesses 17 does not flow out along the longitudinal direction y of the leads 12 so long as the adhesive does not overflow the recesses 17.

Therefore, according to the package 102, as in the first embodiment, the above-mentioned bonding wires 11 can be bonded to the ends of the leads by a suitable bonding process.

According to the package 102 in the second embodiment, because the electronic parts 13 are attached to the recesses 17 that define the lowered portions in the top surfaces of the leads, the height of the package is prevented from increasing in accordance with the thickness of the adhesive 14 lying between the electronic parts 13 and the leads 12 without providing the deformed (recessed) portions as in the first embodiment.

Figure 7:
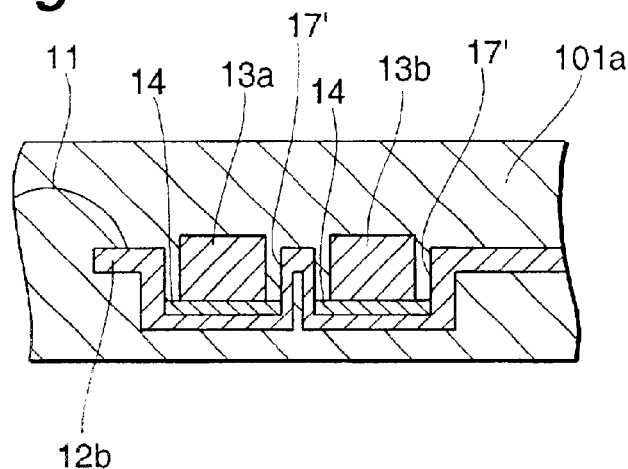
FIG. 7 is a partial sectional view a modification of the second embodiment.

In the package 102 in the second embodiment shown in FIG. 6, the top surfaces of the leads are partially removed by grinding, etching or the like to form shallow grooves serving as the recesses 17 in the leads 12a to 12c. Alternatively, modified grooves 17' as shown in FIG. 7 can be adopted as the recesses that define the adhesion areas. Those modified grooves 17' can be obtained by forming the leads 12 (the lead 12b in FIG. 7) into a deepened shape by stamping, for example.

<Embodiment 3>

Figure 8:
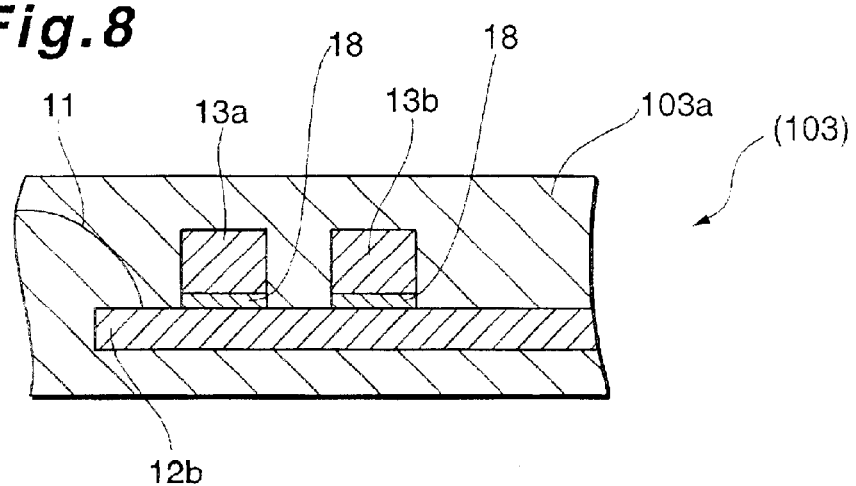
FIG. 8 is a partial sectional view of a resin-molded semiconductor device according to a third embodiment of the present invention.

FIG. 8 shows a third embodiment using adhesive film as the adhesive agent.

In the resin-molded semiconductor device 103 in the third embodiment of the present invention, more specifically, in the semiconductor package 103, the electronic parts 13 are attached to the lead 12b with interposition of a conductive adhesive film 18 in the example in FIG. 8.

For the adhesive film 18, a well-known conductive adhesive film can be used which has conductive particulates dispersed in a thermoplastic or thermosetting synthetic resin film. The electronic parts 13 are attached to the leads so as to be electrically connected by heating the adhesive film 18 in a predetermined heating process.

When electronic parts 13 are attached to the leads 12a to 12c, the above-mentioned adhesive film 18, having non-fluidity, does not overflow the adhesion areas unlike the adhesive 14 which has fluidity.

Therefore, according to the semiconductor package 103, the bonding wires can be bonded to the ends of the leads in a suitable bonding process as in the first and second embodiments.

To prevent an increase in the height of the package, a step portion the same as the one in the first embodiment can be formed in the leads 12a to 12c of the package 103.

Figure 9:
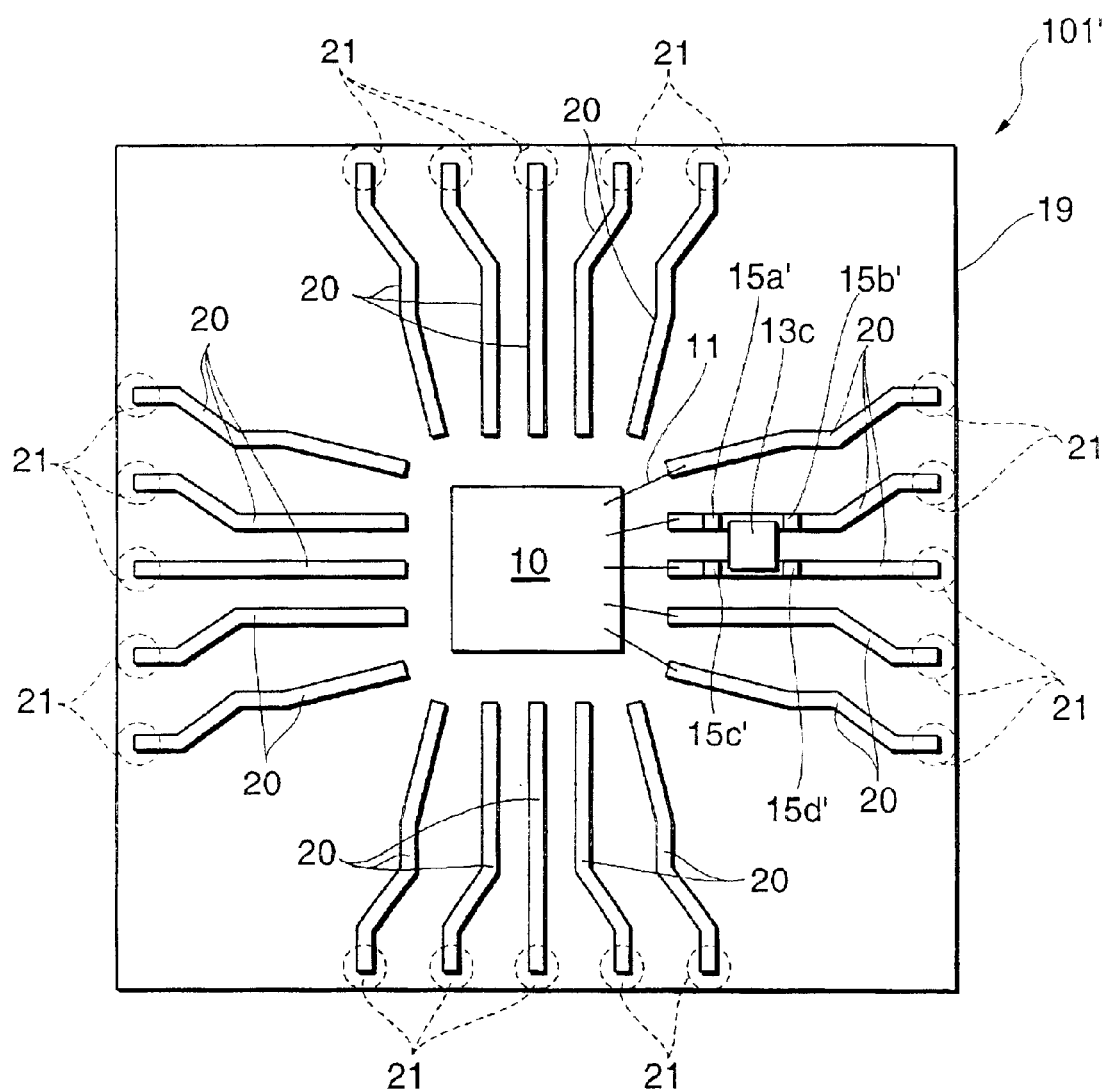
FIG. 9 is a plan view showing an applied example of the resin-molded semiconductor device of the present invention.

In the first to third embodiments of the present invention, cases have been shown in which the SOP is used for semiconductor packages. In the present invention, however, the well-known BGA package, for example, can also be used. FIG. 9 shows a package 101' formed by applying the BGA type design to the first embodiment. The BGA package 101', as has been well known, comprises a substrate 19 made of insulating film or glass or metal as a substrate material, a semiconductor chip 10 and a plurality of conductive patterns 20 connected through bonding wires 11 to the chip, which are provided on one surface of the substrate, and spherical connection terminals 21 provided on the other surface of the substrate 19 and electrically connected to the corresponding conductive patterns 20. All those components are encapsulated in a resin (not shown) similar to the one described above.

The BGA package 101' further comprises an electronic part 13c mounted to connect to corresponding conductive patterns 20 inside the resin, and partition members 15'(15a' to 15d') provided in conjunction with the electronic part. For the partition members 15', polyimide material, for example, the same material as in the first embodiment can be used.

The partition material 15a' is disposed between the connection terminal of a conductive pattern 20, to which a bonding wire 11 extending from the connection terminal of the semiconductor chip 10 is connected, and one connection terminal of the electronic part 13c. The partition member 15b' is disposed on one conductive pattern 20 spaced apart from the partition member 15a' to define an adhesion area for the above-mentioned one connection terminal between the partition member 15b' and the partition member 15a'.

The partition members 15c' and 15d' are disposed on the other corresponding conductive pattern 20 in the same manner as with the partition members 15a' and 15b' to define an adhesion area for the other connection end of the electronic part 13c.

There are bonding wires 11 connected between the other conductive patterns 20 exclusive of the two conductive patterns 20 used to connect to the electronic part 13c, and the other connection terminals of the semiconductor chip 10, but those bonding wires 11 are omitted in FIG. 9 for simplicity of drawing.

According to the BGA package 101', the partition members 15' (15a' to 15d'), which are the same as those described referring to the first embodiment, are provided on two sides of the electronic part 13c which correspond to the two conductive patterns 20 mentioned above, and therefore the bonding wires 11 can be bonded to the connection terminals of the conductive patterns 20 by a suitable bonding process.

What is claimed is:

1. A resin-molded semiconductor device comprising:
    a semiconductor chip with connection terminals;
    a plurality of conductive wires;
    a plurality of conductive paths, each being connected to one of said connection terminals by one of said wires;
    an electronic part mounted on a pair of said conductive paths in such a manner as to electrically connect to said pair of conductive paths through a conductive adhesive that is fluid before hardening and that is disposed between said pair of conductive paths and said electronic part;
    a partition members that are made of insulating material and that are affixed to said pair of conductive paths to prevent said adhesive from flowing out along said pair of conductive paths alone a longitudinal direction thereof before hardening; and
    a molded resin body in which said electronic part and said semiconductor chip are disposed.

2. A resin-molded semiconductor device according to claim 1, wherein each of said conductive paths is one of the leads of a lead frame.

3. A semiconductor device according to claim 1, wherein said semiconductor device is mounted on an insulating film or a substrate material, and wherein each of said conductive paths is a conductive pattern formed on said insulating film or said substrate material.

4. A resin-molded semiconductor device according to claim 1, wherein said partition member is made of a strip-shaped polyimide material having an adhesion surface that is attached to said conductive path.

5. A resin-molded semiconductor device according to claim 1, wherein each of said pair of conductive paths has a width dimension, and wherein said partition members are elongated and extend on said pair of conductive paths in a width direction thereof.

6. A resin-molded semiconductor device comprising:
    a semiconductor chip with connection terminals;
    a plurality of conductive wires;
    a plurality of conductive paths, each being connected to one of said connection terminals by one of said wires; and
    an electronic part mounted on a pair of said conductive paths in such a manner as to electrically connect to said pair of conductive paths through a conductive adhesive that is fluid before hardening and that is disposed between said pair of conductive paths and said electronic part; and
    a molded resin body in which said electronic part and said semiconductor chip are disposed,
    wherein each of said pair of conductive paths has a recess accommodating a connection terminal of said electronic part, and said electronic part is connected to said corresponding conductive path at said recesses through said adhesive.

7. A resin-molded semiconductor device according to claim 6, wherein each of said pair of conductive paths has a width dimension, and said recess is disposed across the width of said conductive path.

8. A resin-molded semiconductor device according to claim 7, wherein, for each conductive path in said pair of conductive paths, said recess prevents said adhesive from flowing out along the respective conductive path in a longitudinal direction thereof before said adhesive hardens.

9. A resin-molded semiconductor device according to claim 6, wherein, for each conductive path in said pair of conductive paths, said recess is defined by a groove formed by partially removing a flat top surface of the respective conductive path.

10. A resin-molded semiconductor device according to claim 6, wherein, for each conductive path in said pair of conductive paths, said recess is defined by a deformation impressed on the respective conductive path.

11. A resin-molded semiconductor device according to claim 6, each of said conductive paths is one of the leads of a lead frame.

12. A resin-molded semiconductor device according to claim 6, wherein said semiconductor chip is mounted on an insulating film or a substrate material, and each of said conductive paths is a conductive pattern formed on said insulating film or on said substrate material.

13. A resin-molded semiconductor device comprising:

a semiconductor chip with connection terminals;

a plurality of conductive wires;

a plurality of conductive paths, each being connected to one of said connection terminals by one of said wires;

an electronic part mounted on a pair of said conductive paths in such a manner as to electrically connect to said pair of conductive paths through a conductive adhesive applied between terminals of said electronic part and said pair of conductive paths; and a molded resin body in which said electronic part and said semiconductor chip are disposed, wherein said adhesive is a non-fluid adhesive film which comprises a synthetic resin film having conductive particulates dispersed therein and which becomes hard on being heated.

14. A resin-molded semiconductor device according to claim 13, wherein said synthetic resin film has a thermosetting property or thermoplasticity.

15. A resin-molded semiconductor device according to claim 13, wherein each of said conductive paths is one of the leads of a lead frame.

16. A resin-molded semiconductor device according to claim 13, wherein said pair of conductive paths is provided by a pair of leads in a lead frame, and wherein each lead of said pair of leads has a deformed portion with a difference in level such that an area where said electronic part is disposed is lower than another area of said lead.

17. A resin-molded semiconductor device according to claim 13, wherein said semiconductor device is mounted on an insulating film or a substrate material, and wherein each of said conductive paths is a conductive pattern formed on said insulating film or said substrate material.

* * * * *